US009318219B2

(12) United States Patent
Yang et al.

(10) Patent No.: US 9,318,219 B2
(45) Date of Patent: Apr. 19, 2016

(54) SHIFT REGISTER UNIT AND DISPLAY DEVICE

(71) Applicants:BOE TECHNOLOGY GROUP CO., LTD., Beijing (CN); HEFEI BOE OPTOELECTRONICS TECHNOLOGY CO., LTD., Hefei, Anhui (CN)

(72) Inventors: Tong Yang, Beijing (CN); Rui Ma, Beijing (CN); Ming Hu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 11 days.

(21) Appl. No.: 14/365,840

(22) PCT Filed: Jun. 21, 2013

(86) PCT No.: PCT/CN2013/077672
§ 371 (c)(1),
(2) Date: Jun. 16, 2014

(87) PCT Pub. No.: WO2014/172980
PCT Pub. Date: Oct. 30, 2014

(65) Prior Publication Data
US 2015/0248940 A1    Sep. 3, 2015

(30) Foreign Application Priority Data

Apr. 24, 2013  (CN) .......................... 2013 1 0146325

(51) Int. Cl.
*G11C 19/00*  (2006.01)
*G11C 19/28*  (2006.01)
*G09G 3/36*   (2006.01)

(52) U.S. Cl.
CPC .............. *G11C 19/28* (2013.01); *G09G 3/3648* (2013.01); *G09G 3/3677* (2013.01); *G09G 2310/0286* (2013.01)

(58) Field of Classification Search
CPC ........................................................ G11C 19/28
USPC ........................................................... 377/64
See application file for complete search history.

(56) References Cited

U.S. PATENT DOCUMENTS

| 5,859,630 | A  | * | 1/1999  | Huq ................................ 345/100 |
| 6,064,713 | A  | * | 5/2000  | Lebrun et al. .................... 377/67 |
| 8,351,563 | B2 | * | 1/2013  | Yang et al. ....................... 377/64 |
| 8,542,178 | B2 | * | 9/2013  | Yoo et al. ........................ 345/100 |
| 2012/0249502 | A1 | * | 10/2012 | Takahashi et al. ............. 345/205 |
| 2013/0177128 | A1 | * | 7/2013  | Ko et al. ........................... 377/64 |

FOREIGN PATENT DOCUMENTS

CN      102945651 A       2/2013
EP      2525350 A1 *     11/2012    ............... G09G 3/36

OTHER PUBLICATIONS

Written Opinion of the International Searching Authority dated Jan. 20, 2014; PCT/CN2013/077672.
First Chinese Office Action Appln. No. 201310146325.6; Dated Oct. 10, 2014.

* cited by examiner

*Primary Examiner* — Ryan Jager
(74) *Attorney, Agent, or Firm* — Ladas & Parry LLP

(57) ABSTRACT

There are provided a shift register unit and a display device in embodiments of the present disclosure, for solving the problem that since two different transistors are used to respectively pull-up and pull-down a gate line connected to a conventional shift register unit, the conventional shift register unit occupies a large area, which causes a large consumption of materials when manufacturing the shift register unit, a high cost of the conventional shift register unit, and a high cost of a display device comprising the conventional shift register unit. The shift register unit comprises: a first capacitor, a first transistor, a pull-up module and a first pull-down module, wherein the first capacitor has a first electrode configured to receive a clock signal, a gate connected with one terminal of the first capacitor, the pull-up module and the first pull-down module, and a second electrode connected with the other terminal of the first capacitor. The first transistor in the shift register unit pull-up or pull-down the level at the gate line connected to the shift register unit.

20 Claims, 10 Drawing Sheets

SHIFT REGISTER UNIT AND DISPLAY DEVICE

TECHNICAL FIELD OF THE DISCLOSURE

The present disclosure relates to the field of display technology, and particularly to a shift register unit and a display device.

BACKGROUND

Liquid crystal display (LCD) or organic light-emitting diode (OLED) has advantages of low radiation, small volume, low power consumption and the like, and has gradually replaced the conventional cathode ray tube display (CRT) to be widely used in information products such as notebook computers, personal digital assistants (PDA), flat television sets, and mobile phones, etc. The conventional liquid crystal display adopts external driving chips to drive chips on a panel to display an image. In order to reduce the number of elements and reduce manufacture cost, there is an increasing trend that the structure of a driving circuit has been produced directly on a display panel in recent years, for example, a technology of integrating a gate driver on a liquid crystal panel, that is, Gate on Array (GOA), has been adopted.

At present, a common shift register unit is as shown in FIG. 1, and comprises transistors T1, T2, T3 and T4, a capacitor C1 and a pull-down circuit 11. Assuming that the shift register unit as shown in FIG. 1 is an $N^{th}$ stage of shift register unit, the transistor T1 has a gate configured to receive a signal output from an $(N-1)^{th}$ stage of shift register unit, a source configured to receive a VDD signal, and a drain connected to a gate of the transistor T2; the transistor T2 has a source configured to receive a clock signal CLK and a drain configured as an output terminal of the $N^{th}$ stage of shift register unit; the capacitor C1 has one terminal connected to the gate of the transistor T2 and the other terminal connected to the drain of the transistor T2; the transistor T3 has a source connected to the gate of the transistor T2, a gate configured to receive a signal output from an $(N+1)^{th}$ stage of shift register unit, and a drain configured to receive a VSS signal; the transistor T4 has a source connected to the drain of the transistor T2, a gate configured to receive a signal output from an $(N+1)^{th}$ stage of shift register unit, and a drain configured to receive a VSS signal; the pull-down circuit 11 is connected to the gate and the drain of the transistor T2.

When the transistor T1 is turned on by a high level signal output from the $(N-1)^{th}$ stage of shift register unit, a scan gate line connected to the $N^{th}$ stage of shift register unit is activated, the transistor T2 is turned on since the gate of the transistor T2 receives the VDD signal, and thus the $N^{th}$ stage of shift register unit outputs the CLK signal, at this time, the $N^{th}$ stage of shift register unit outputs a low level signal since the CLK signal is the low level signal. When the CLK signal changes to the high level signal, the $(N-1)^{th}$ stage of shift register unit outputs the low level signal and thus the transistor T1 is turned off, but the transistor T2 is kept to be turned on due to the charge storage function of the capacitor C1, such that the $N^{th}$ stage of shift register unit outputs the high level signal and thus a scan gate line connected to the $(N+1)^{th}$ stage of shift register unit is activated, the scan gate line connected to the $N^{th}$ stage of shift register unit is charged through the transistor T2 so as to increase the voltage on the scan gate line connected to the $N^{th}$ stage of shift register unit; when the $N^{th}$ stage of shift register unit receives the high level signal output from the $(N+1)^{th}$ stage of shift register unit, the transistor T3 is turned on such that the gate of the transistor T2 receives the VSS signal and thus the transistor T2 is turned off, the gate line connected to the $N^{th}$ stage of shift register unit is discharged through the transistor T4 so as to decrease the voltage on the gate line connected to the $N^{th}$ stage of shift register unit. At this time, the gate line connected to the $N^{th}$ stage of shift register unit is not activated any longer, and thus the function that the gate lines connected to the respective stages of shift register units respectively are activated sequentially is achieved. Thereafter, the pull-down circuit 11 is used to make the $N^{th}$ stage of shift register unit output a stable voltage.

In the circuit as shown in FIG. 1, the transistor T2 configured to pull-up the gate line corresponding to the shift register unit and the transistor T4 configured to pull-down the gate line corresponding to the shift register unit are designed separately, since these two transistors T2 and T4 are used to charge or discharge a whole gate line, the sizes of these two transistors T2 and T4 are much larger than those of other transistors in the shift register unit, that is, such a shift register unit occupies a large area, such that the area of the glass substrate as required is large when producing a same number of shift register units thereon, which causes a large consumption of materials such as glass substrate and the like, a high cost for manufacturing such a shift register unit, and a high cost for manufacturing a display device comprising such a shift register unit.

To sum up, since the transistors configured to pull-up or pull-down the gate line connected to the conventional shift register unit are designed separately when the conventional shift register unit charges or discharges the gate line connected thereto, and since the sizes of these two transistors are much larger than those of other transistors in the shift register unit, such a shift register unit occupies a large area, such that the area of the glass substrate carrying such a shift register unit is large, which causes a large consumption of materials, a high cost for manufacturing such a shift register unit, and a high cost for manufacturing a display device comprising such a shift register unit.

SUMMARY

In embodiments of the present disclosure, there are provided a shift register unit and a display device for solving the problem that since two different transistors are used to respectively pull-up and pull-down the gate line connected to the conventional shift register unit, the conventional shift register unit occupies a large area, which causes a large consumption of materials when manufacturing the shift register unit, a high cost for manufacturing the shift register unit, and a high cost for manufacturing a display device comprising the shift register unit.

The shift register unit provided in the embodiments of the present disclosure comprises a first capacitor, a first transistor, a pull-up module and a first pull-down module.

The first transistor has a first electrode configured to receive a clock signal, a gate connected with one terminal of the first capacitor, the pull-up module and the first pull-down module, and a second electrode connected with the other terminal of the first capacitor.

The pull-up module is configured to output a first level signal to the gate of the first transistor when the clock signal is a second level signal and a pull-up selection signal is the first level signal; and to not output the first level signal to the gate of the first transistor when the clock signal is the first level signal and the pull-up selection signal is the second level signal. The pull-up selection signal is a signal output from a previous stage of shift register unit.

The first pull-down module is configured to connect the gate of the first transistor and a second level signal input terminal when the clock signal is the first level signal and a first pull-down selection signal is the first level signal. The first pull-down selection signal is a signal output from a shift register unit two-stage subsequent to the present stage of shift register unit.

The first transistor is configured to output the received clock signal from the second electrode of the first transistor when a signal at the gate of the first transistor is the first level signal; and to not output the received clock signal from the second electrode of the first transistor when the signal at the gate of the first transistor is the second level signal.

The display device provided in the embodiments of the present disclosure comprises the shift register unit provided in the embodiments of the present disclosure.

According to the shift register unit and the display device provided in the embodiments of the present disclosure, when the shift register unit receives the first level signal output from a shift register unit one-stage previous to the shift register unit, the first transistor in the shift register unit is turned on, the gate line connected to the shift register unit is activated when the first transistor is turned on since the second electrode of the first transistor is the output terminal of the shift register unit; when the shift register unit receives the second level signal output from the shift register unit one-stage previous to the shift register unit, the pull-up module does not output the first level signal to the gate of the first transistor any longer, but the signal at the gate of the first transistor in the shift register unit is still the first level signal and the first transistor is still turned on and outputs the received clock signal being a first level due to the charge storage function of the first capacitor, such that the gate line connected to a shift register unit one-stage subsequent to the shift register unit is activated; when the shift register unit receives the first level signal output from a shift register unit two-stage subsequent to the shift register unit, the first transistor in the shift register unit is turned off since the signal at the gate of the first transistor is the second level signal, and thus the gate line connected to the shift register unit is not activated any longer, therefore the function that the gate lines connected to the respective stages of shift register units are activated sequentially is achieved.

Since the period in which the gate line connected to the shift register unit is activated is the period from the timing at which the shift register unit begins to receive the first level signal output from the shift register unit one-stage previous to the shift register unit to the timing at which the shift register unit begins to receive the first level signal output from the shift register unit two-stage subsequent to the shift register unit, such a period is one and half cycles of the clock signal. During the period in which the gate line connected to the shift register unit is activated, the first transistor in the shift register unit is turned on such that the received clock signal is transmitted to the gate line connected to the shift register unit. Therefore, change of the level on the gate line from the second level to the first level and from the first level to the second level is implemented through the first transistor in the shift register unit, that is, the first transistor in the shift register unit can be used to pull-up and pull-down the level on the gate line connected to the shift register unit, such that the number of the transistors configured to charge and discharge the gate line is reduced, size of the shift register unit is reduced, materials used for manufacturing the shift register unit is saved, cost for manufacturing the shift register unit is reduced and cost for manufacturing the display device comprising the shift register unit is also reduced.

DETAILED DESCRIPTION

In the embodiments of the present disclosure, there are provided a shift register unit and a display device. A first transistor in the shift register unit pulls up or pulls down a level at a gate line connected with the shift register unit, and thus the number of transistors configured to charge and discharge the gate line can be reduced, so that the size of the shift register unit is reduced, material used for manufacturing the shift register unit is saved, and cost of the shift register unit and cost of the display device including the shift register unit are reduced.

Hereinafter, particular implementations of a shift register unit and a display device provided in the embodiments of the present disclosure will be described with reference to the accompanying drawings of the embodiments of the present disclosure.

Figure 2:
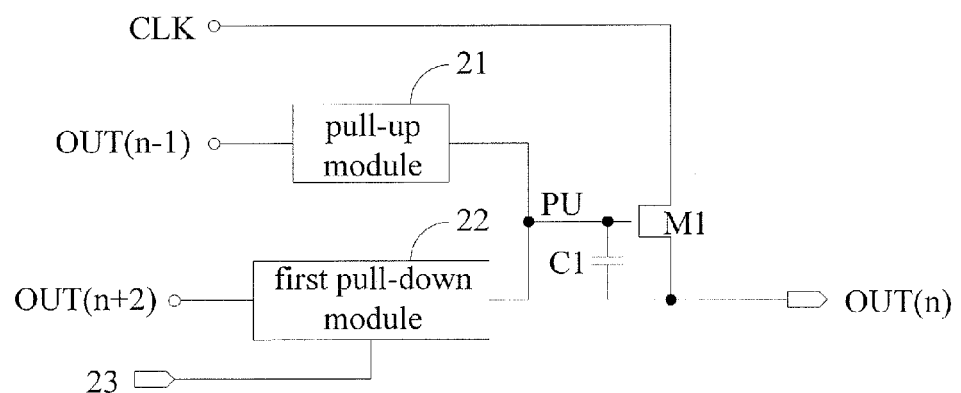
FIG. 2 is a first schematic structure diagram of a shift register unit provided in embodiments of the present disclosure.

The shift register unit provided in the embodiments of the present disclosure is as shown in FIG. 2, and comprises: a first capacitor C1, a first transistor M1, a pull-up module 21 and a first pull-down module 22. The first transistor M1 has a first electrode configured to receive a clock signal CLK, a gate connected with a terminal of the first capacitor C1, the pull-up module 21 and the first pull-down module 22, and a second electrode connected with the other terminal of the first capacitor C1. The gate of the first transistor M1 functions as a pull-up node PU. The second electrode of the first transistor M1 functions as an output terminal of the shift register unit. When the shift register unit functions as an $n^{th}$ stage of shift register unit, the output terminal of the shift register unit outputs a signal OUT(n).

The pull-up module 21 outputs a first level signal to the gate of the first transistor M1 when the clock signal CLK is a second level signal and a pull-up selection signal is the first level signal; and does not output the first level signal to the gate of the first transistor M1 when the clock signal CLK is the first level signal and the pull-up selection signal is the second level signal. The pull-up selection signal is the signal output from the output terminal of a previous stage of shift register unit. When the shift register unit is the $n^{th}$ stage of shift register unit, the pull-up selection signal received by the shift register unit is the signal OUT(n−1) output from an $(n-1)^{th}$ stage of shift register unit.

The first pull-down module 22 is configured to connect the gate of the first transistor M1 and a second level signal input terminal 23 when the clock signal CLK is the first level signal and a first pull-down selection signal is the first level signal. The first pull-down selection signal is the signal output from the output terminal of the shift register unit two-stage subsequent thereto. When the shift register unit is the $n^{th}$ stage of shift register unit, the first pull-down selection signal received by the shift register unit is a signal OUT(n+2) output from an $(n+2)^{th}$ stage of shift register unit.

The first transistor M1 outputs the received clock signal CLK from the second electrode of the first transistor M1 (that is, the output terminal of the shift register unit) when a signal at the gate of the first transistor M1 is the first level signal; and does not output the received clock signal CLK from the second electrode of the first transistor M1 (that is, the output terminal of the shift register unit) when the signal at the gate of the first transistor M1 is the second level signal.

When the present stage of shift register unit is the $n^{th}$ stage of shift register unit, the signal OUT(n−1) output from the previous stage of shift register unit is the first level signal, that is, the gate of the first transistor M1 in the $n^{th}$ stage of shift register unit is turned on upon receiving the pull-up selection signal being the first level signal, then the gate line connected with the $n^{th}$ stage of shift register unit is activated, so that the first transistor M1 in the $n^{th}$ stage of shift register unit outputs the received clock signal CLK being the second level signal to the gate line connected with the $n^{th}$ stage of shift register unit, and thus the level at the gate line is a second level. When the signal OUT(n−1) output from the $(n-1)^{th}$ stage of shift register unit is the second level signal, the gate of the first transistor M1 in the $n^{th}$ stage of shift register unit does not receive the first level signal any longer, the signal at the gate of the shift transistor M1 is kept to be the first level signal due to charge storage function of the first capacitor C1, so that the first transistor M1 in the $n^{th}$ stage of shift register unit outputs the received clock signal CLK being the first level signal to the gate line connected with the $n^{th}$ stage of shift register unit, and thus the level at the gate line is a first level, thereby achieving the function that the first transistor M1 in the $n^{th}$ stage of shift register unit changes the level at the gate line from the second level to the first level.

Meanwhile, since the signal OUT(n) output from the $n^{th}$ stage of shift register unit is also used as the pull-up selection signal received by the $(n+1)^{th}$ stage of shift register unit, when the signal OUT(n) output from the $n^{th}$ stage of shift register unit is the first level signal, the pull-up selection signal received by the $(n+1)^{th}$ stage of shift register unit is the first level signal. The $(n+1)^{th}$ stage of shift register unit operates according to a same operational principle as that followed by the $n^{th}$ stage of shift register unit, that is, the $(n+1)^{th}$ stage of shift register unit outputs the clock signal CLK received by itself, particularly, firstly outputs the second level signal and then outputs the first level signal. Since the level of the clock signal received by one of two adjacent stages of shift register units is opposite to the level of the clock signal received by the other of the two adjacent stages of shift register units, the clock signal CLK received at the first electrode of the first transistor M1 in the $n^{th}$ stage of shift register unit is the second level signal when the $(n+1)^{th}$ stage of shift register outputs the first level signal. At this time, the signal at the gate of the first transistor M1 in the $n^{th}$ stage of shift register unit is still the first level signal due to the charge storage function of the first capacitor C1, that is, the first transistor M1 in the $n^{th}$ stage of shift register unit is turned on, and a conductive path is established between the first electrode and the second electrode of the $n^{th}$ stage of shift register unit. Since the level at the gate line connected with the second electrode of the first transistor M1 in the $n^{th}$ stage of shift register unit (that is, the output terminal of the $n^{th}$ stage of shift register unit) is the first level previously, the first transistor M1 being kept to be turned on changes the level at the gate line connected with the $n^{th}$ stage of shift register unit from the first level to the second level, thereby achieving the function that the first transistor M1 in the $n^{th}$ stage of shift register unit pulls up or pulls down the level at the gate line connected with the $n^{th}$ stage of shift register unit.

When the pull-up selection signal received by a shift register unit two-stage subsequent to the $n^{th}$ stage of shift register unit (that is, the $(n+2)^{th}$ stage of shift register unit), that is, the signal output from the $(n+1)^{th}$ stage of shift register, is the first level signal, the $(n+2)^{th}$ stage of shift register unit operates according to a same operational principle as that followed by the $n^{th}$ stage of shift register unit, that is, the $(n+2)^{th}$ stage of shift register unit outputs the clock signal CLK received by itself, particularly, firstly outputs the second level signal and then outputs the first level signal. Since the level of the clock signal received by one of two adjacent stages of shift register units is opposite to the level of the clock signal received by the other of the two adjacent stages of shift register units, the clock signal received in the $n^{th}$ stage of shift register unit is same as that received in the $(n+2)^{th}$ stage of shift register. The clock signal received in the $n^{th}$ stage of shift register unit is the first level signal when the $(n+2)^{th}$ stage of shift register outputs the first level signal. At this time, the first transistor M1 in the $n^{th}$ stage of shift register unit does not output the received clock signal via the output terminal of the $n^{th}$ stage of shift register unit no longer, so that the gate line connected with the $n^{th}$ stage of shift register unit is not activated any longer, thereby achieving the function that the gate lines connected with the shift register units respectively are activated sequentially. Since the $n^{th}$ stage of shift register unit can achieve the function that the first transistor M1 therein increases or decreases the level at the gate line connected with the $n^{th}$ stage of shift register unit, as compared to the known shift register unit, the number of the transistors used to charge and discharge the gate line is decreased, the size of the shift register unit is reduced, material used for manufacturing the shift register unit is saved, and cost for manufacturing the shift register unit and cost for manufacturing the display device including the shift register unit are reduced.

Figure 3:
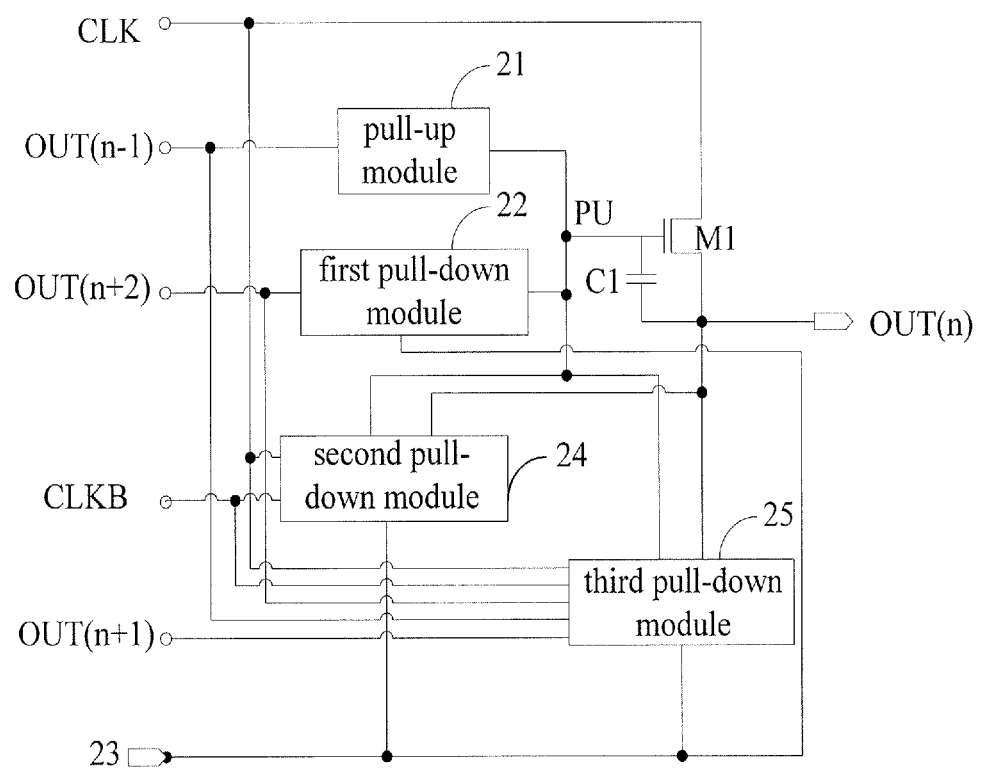
FIG. 3 is a second schematic structure diagram of the shift register unit provided in the embodiments of the present disclosure.

Furthermore, as shown in FIG. 3, the shift register unit provided in the embodiments of the present disclosure further comprises a second pull-down module 24 connected with the gate and the second electrode of the first transistor M1. The second pull-down module 24 is configured to control the gate and the second electrode of the first transistor M1 to be connected with the second level signal input terminal 23 when the signal at the gate of the first transistor M1 is the second level signal, the clock signal CLK is the first level signal and a clock blocking signal CLKB is the second level signal; to control the gate and the second electrode of the first transistor M1 to be disconnected from the second level signal input terminal 23 when the signal at the gate of the first transistor M1 is the second level signal, the clock signal CLK is the second level signal and a clock blocking signal CLKB is the first level signal; and to control the gate and the second electrode of the first transistor M1 to be disconnected from the second level signal input terminal 23 when the signal at the gate of the first transistor M1 is the first level signal.

Furthermore, as shown in FIG. 3, the shift register unit provided in the embodiments of the present disclosure further comprises a third pull-down module 25 connected with the gate and the second electrode of the first transistor M1. The third pull-down module 25 is configured to control the gate and the second electrode of the first transistor M1 to be disconnected from the second level signal input terminal 23 when the pull-up selection signal is the first level signal, or a second pull-down selection signal is the first level signal or the clock blocking signal CLKB is the second level signal; to control the gate and the second electrode of the first transistor M1 to be connected with the second level signal input terminal 23 when the pull-up selection signal, the first pull-down selection signal and the second pull-down selection signal are all the second level signal and the clock signal CLK is the second level signal and the clock blocking signal CLKB is the first level signal. The second pull-down selection signal is the signal output from the output terminal of a stage of shift register unit subsequent to the present stage of shift register unit.

When the shift register unit provided in the embodiments of the present disclosure is the $n^{th}$ stage of shift register unit, the pull-up selection signal received by the shift register unit provided in the embodiments of the present disclosure is the signal output from the $(n-1)^{th}$ stage of shift register unit, the first pull-down selection signal received by the shift register unit provided in the embodiments of the present disclosure is the signal output from the $(n+2)^{th}$ stage of shift register unit, and the second pull-down selection signal received by the shift register unit provided in the embodiments of the present disclosure is the signal output from the $(n+1)^{th}$ stage of shift register unit.

The shift register unit provided in the embodiments of the present disclosure can only comprise the second pull-down module, and can also only comprise the third pull-down module. Optionally, the shift register unit provided in the embodiments of the present disclosure comprise both the second pull-down module and the third pull-down module, such that during the period that the gate line connected with the shift register unit provided in the embodiments of the present disclosure is not activated, the second pull-down module can make the gate of the first transistor M1 in the shift register unit provided in the embodiments of the present disclosure and the output terminal of the shift register unit be connected with the second level signal input terminal when the clock signal and the clock blocking signal received by the shift register unit provided in the embodiments of the present disclosure are the first level signal and the second level signal respectively; and the third pull-down module can make the gate of the first transistor M1 in the shift register unit provided in the embodiments of the present disclosure and the output terminal of the shift register unit be connected with the second level signal input terminal when the clock signal and the clock blocking signal received by the shift register unit provided in the embodiments of the present disclosure are the second level signal and the first level signal respectively. In such manner, during the period that the gate line connected with the shift register unit provided in the embodiments of the present disclosure is not activated, coupling noise generated by the clock signal can be released through the second level signal input terminal and cannot be output to the gate line connected with the shift register unit, thus guaranteeing that the output terminal of the shift register unit outputs a stable voltage signal.

Meanwhile, since the second pull-down module and the third pull-down module make the gate of the first transistor M1 in the shift register unit provided in the embodiments of the present disclosure and the output terminal of the shift register unit be connected with the second level signal input terminal alternately, the problem of drifts of threshold voltages of transistors in the second pull-down module and the third pull-down module caused when the transistors in the second pull-down module and the third pull-down module are kept to be turned on for a long time can be eliminated, thus prolonging lifespan of the shift register unit.

Figure 1:
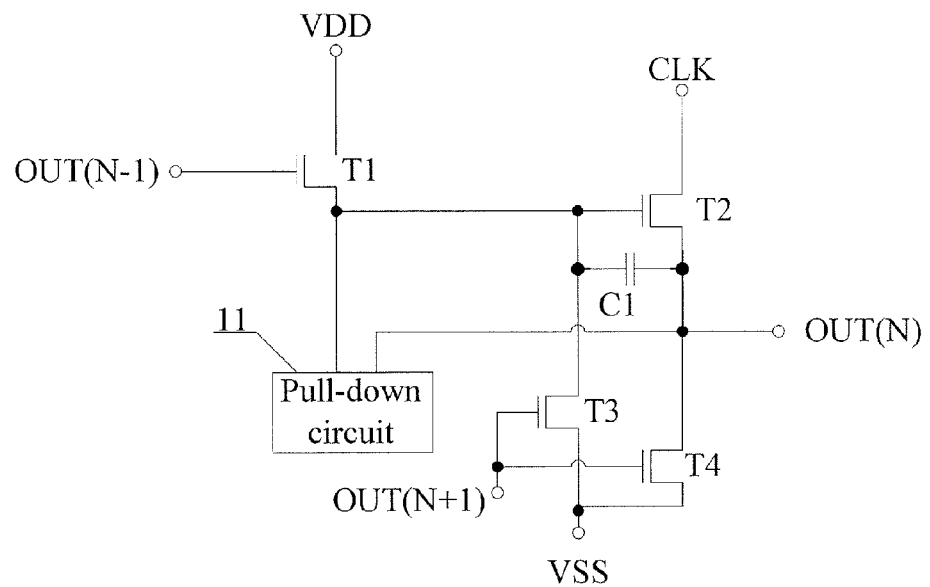
FIG. 1 is a schematic structure diagram of a known shift register unit.

In addition, since the second pull-down module and the third pull-down module cannot charge and discharge the gate line connected with the shift register unit, the second pull-down module and the third pull-down module can be made in a small size, so that the shift register unit comprising the second pull-down module and the third pull-down module provided in the embodiments of the present disclosure has a smaller size than a shift register unit which adopts two transistors to increase and decrease the voltage at the gate line connected thereto respectively, for example, the shift register unit as shown in FIG. 1.

Figure 4:
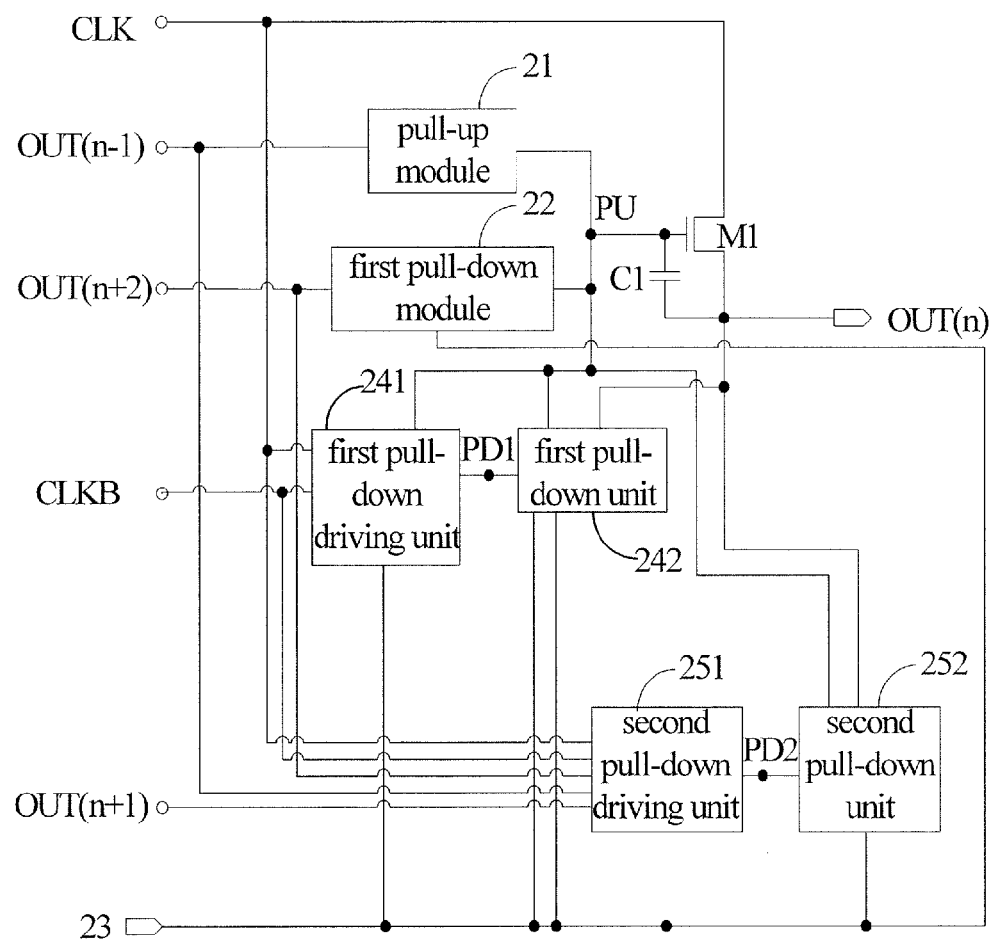
FIG. 4 is a third schematic structure diagram of the shift register unit provided in the embodiments of the present disclosure.

Furthermore, as shown in FIG. 4, the second pull-down module in the shift register unit provided in the embodiments of the present disclosure comprises a first pull-down driving unit 241 and a first pull-down unit 242. A connection point at which the first pull-down driving unit 241 and the first pull-down unit 242 are connected with each other functions as a first pull-down node PD1.

The first pull-down driving unit 241 is configured to control a signal at the first pull-down node PD1 to be the second level signal when the signal at the gate of the first transistor M1 is the first level signal; to control the signal at the first pull-down node PD1 to be the first level signal when the signal at the gate of the first transistor M1 is the second level signal, the clock signal CLK is the first level signal and the clock blocking signal CLKB is the second level signal; and to control the signal at the first pull-down node PD1 to be the second level signal when the signal at the gate of the first transistor M1 is the second level signal, the clock signal CLK is the second level signal and the clock blocking signal CLKB is the first level signal.

The first pull-down unit 242 is configured to control the gate and the second electrode of the first transistor M1 to be connected with the second level signal input terminal 23 when the signal at the first pull-down node PD1 is the first level signal; and to control the gate and the second electrode of the first transistor M1 to be disconnected from the second level signal input terminal 23 when the signal at the first pull-down node PD1 is the second level signal.

Furthermore, as shown in FIG. 4, the third pull-down module in the shift register unit provided in the embodiments of the present disclosure comprises a second pull-down driving unit 251 and a second pull-down unit 252. A connection point at which the second pull-down driving unit 251 and the second pull-down unit 252 are connected with each other functions as a second pull-down node PD2.

The second pull-down driving unit 251 is configured to control a signal at the second pull-down node PD2 to be the second level signal when the pull-up selection signal is the first level signal, or a second pull-down selection signal is the first level signal or the clock blocking signal CLKB is the second level signal; and to control the signal at the second pull-down node PD2 to be the first level signal when the pull-up selection signal, the first pull-down selection signal and the second pull-down selection signal are all the second level signal and the clock signal CLK is the second level signal and the clock blocking signal CLKB is the first level signal.

The second pull-down unit 252 is configured to control the gate and the second electrode of the first transistor M1 to be connected with the second level signal input terminal 23 when the signal at the second pull-down node PD2 is the first level signal; and to control the gate and the second electrode of the first transistor M1 to be disconnected from the second level signal input terminal 23 when the signal at the second pull-down node PD2 is the second level signal.

Figure 5:
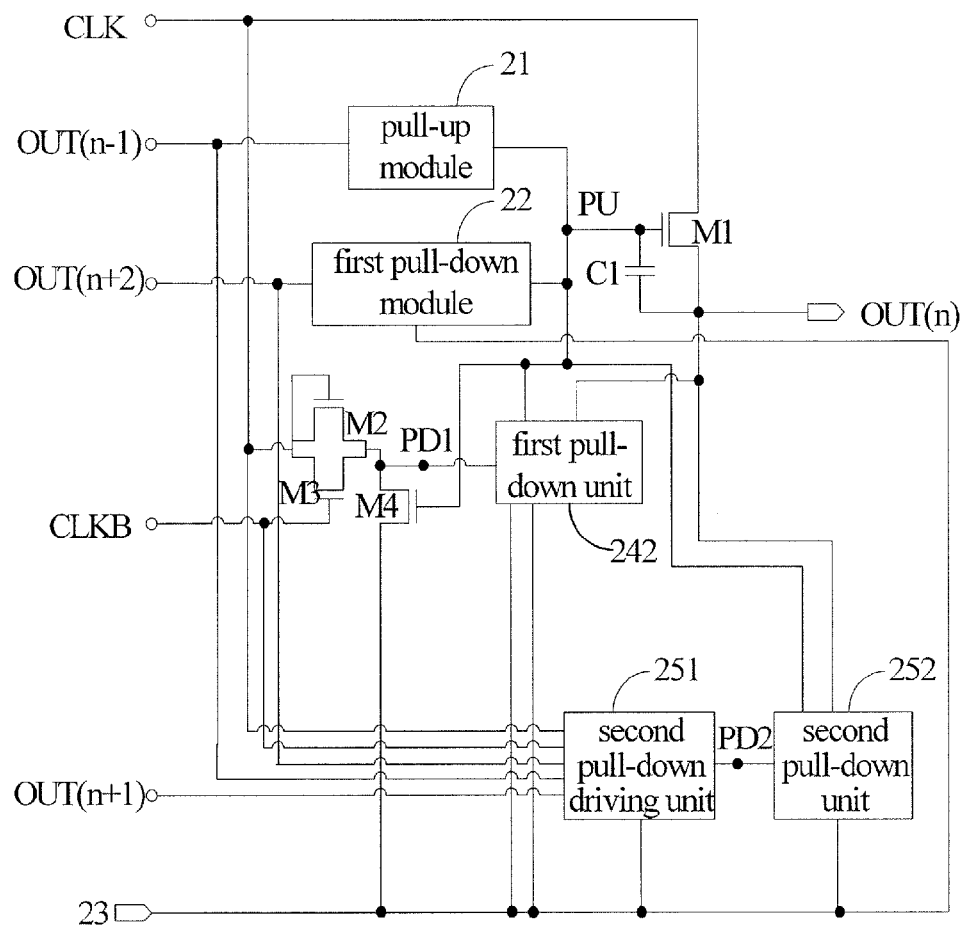
FIG. 5 is a fourth schematic structure diagram of the shift register unit provided in the embodiments of the present disclosure.

Furthermore, as shown in FIG. 5, the first pull-down driving unit in the shift register unit provided in the embodiments of the present disclosure comprises a second transistor M2, a third transistor M3 and a fourth transistor M4. The second transistor M2 has a first electrode configured to receive the clock signal CLK, a gate configured to receive the clock signal CLK, and a second electrode connected with the first pull-down node PD1. The third transistor M3 has a first electrode configured to receive the clock signal CLK, a gate configured to receive the clock blocking signal CLKB, and a second electrode connected with the first pull-down node PD1. The fourth transistor M4 has a first electrode connected with the first pull-down node PD1, a gate connected with the gate of the first transistor M1 (that is, the pull-up node PU), and a second electrode connected with the second level signal input terminal 23.

The second transistor M2 is configured to be turned on when the clock signal CLK is the first level signal and to be turned off when the clock signal CLK is the second level signal. The third transistor M3 is configured to be turned on when the clock blocking signal CLKB is the first level signal and to be turned off when the clock blocking signal CLKB is the second level signal. The fourth transistor M4 is configured to control the first pull-down node PD1 and the second level signal input terminal 23 to be connected with each other when the signal at the gate of the first transistor M1 is the first level signal; and to control the first pull-down node PD1 and the second level signal input terminal 23 to be disconnected from each other when the signal at the gate of the first transistor M1 is the second level signal.

Figure 6:
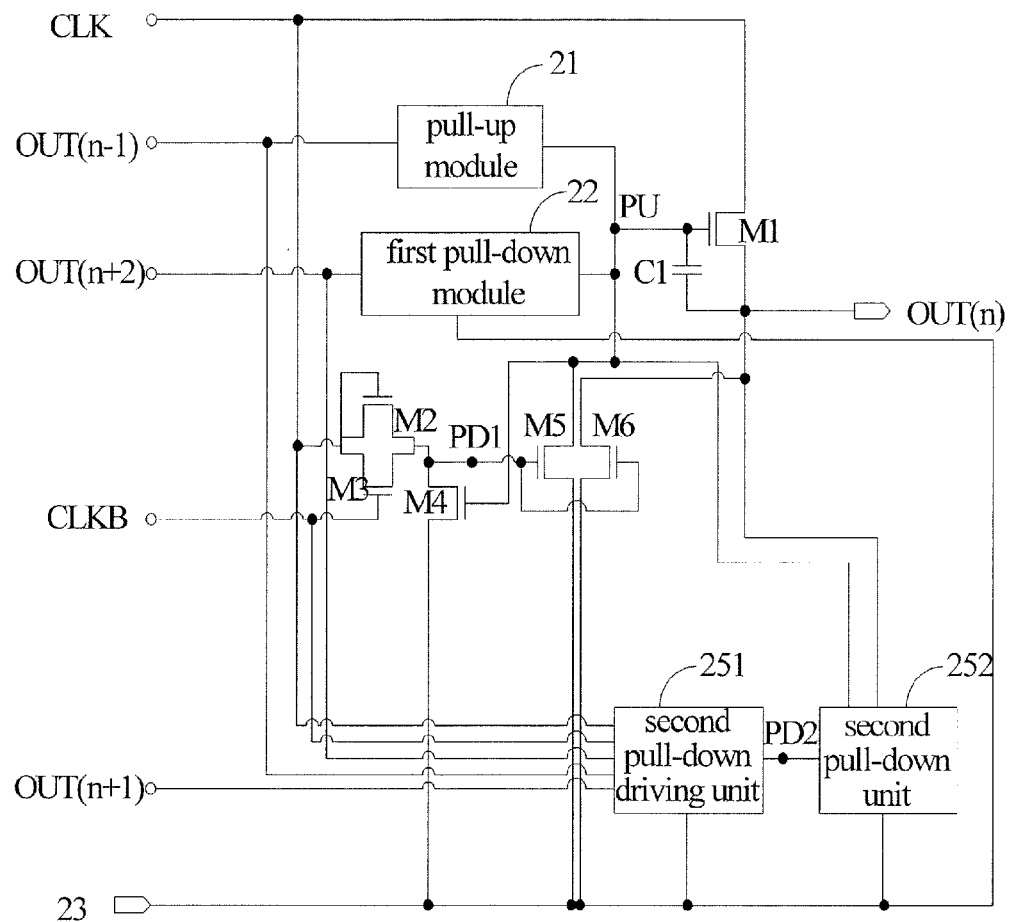
FIG. 6 is a fifth schematic structure diagram of the shift register unit provided in the embodiments of the present disclosure.

Furthermore, as shown in FIG. 6, the first pull-down unit in the shift register unit provided in the embodiments of the present disclosure comprises a fifth transistor M5 and a sixth transistor M6. The fifth transistor M5 has a first electrode connected with the gate of the first transistor M1, a gate connected with the first pull-down node PD1, and a second electrode connected with the second level signal input terminal 23. The sixth transistor M6 has a first electrode connected with the second electrode of the first transistor M1 (that is, the output terminal of the shift register unit), a gate connected with the first pull-down node PD1, and a second electrode connected with the second level signal input terminal 23.

The fifth transistor M5 is configured to be turned on when the signal at the first pull-down node PD1 is the first level signal, so as to make the gate of the first transistor M1 and the second level signal input terminal 23 be connected with each other; and to be turned off when the signal at the first pull-down node PD1 is the second level signal, so as to make the gate of the first transistor M1 and the second level signal input terminal 23 be disconnected from each other. The fifth transistor M6 is configured to be turned on when the signal at the first pull-down node PD1 is the first level signal, so as to make the second electrode of the first transistor M1 and the second level signal input terminal 23 be connected with each other; and to be turned off when the signal at the first pull-down node PD1 is the second level signal, so as to make the second electrode of the first transistor M1 and the second level signal input terminal 23 be disconnected from each other.

Figure 7:
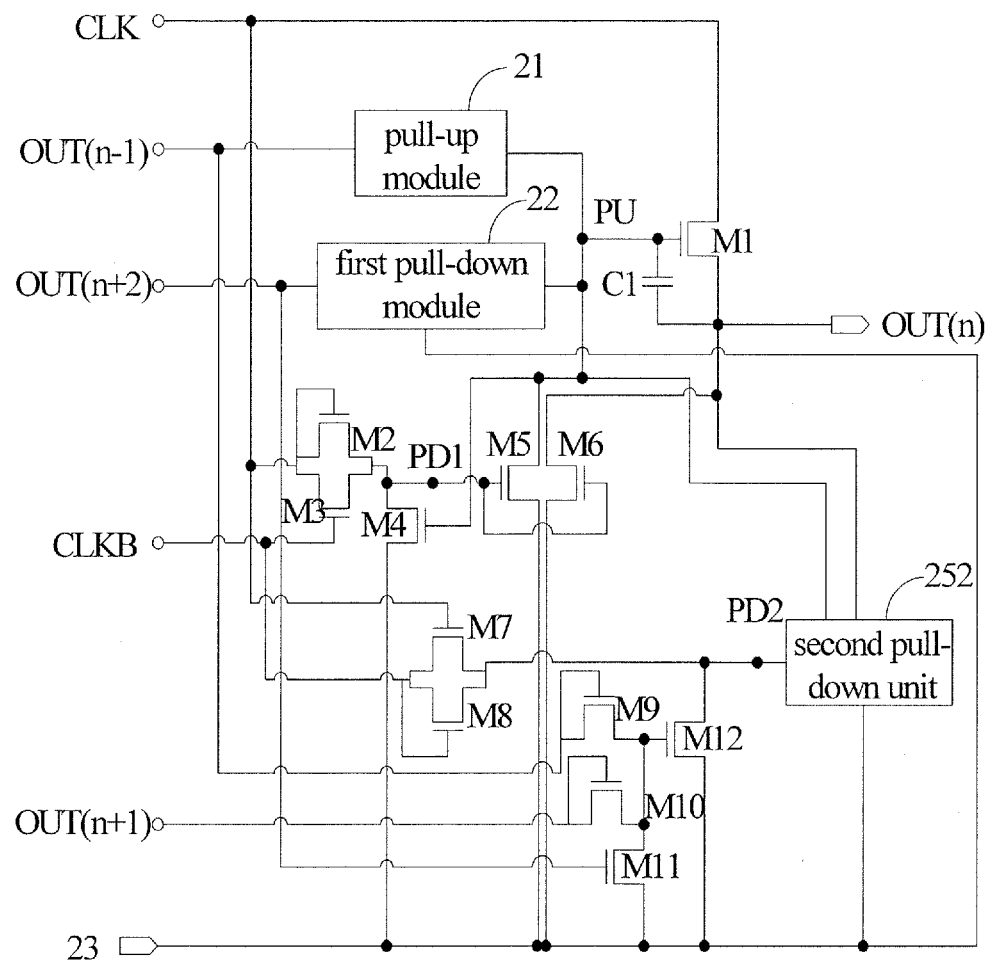
FIG. 7 is a sixth schematic structure diagram of the shift register unit provided in the embodiments of the present disclosure.

Furthermore, as shown in FIG. 7, the second pull-down driving unit in the shift register unit provided in the embodiments of the present disclosure comprises a seventh transistor M7, an eighth transistor M8, a ninth transistor M9, a tenth transistor M10, an eleventh transistor M11 and a twelfth transistor M12.

The seventh transistor M7 has a first electrode configured to receive the clock blocking signal CLKB, a gate configured to receive the clock signal CLK, and a second electrode connected with the second pull-down node PD2. The eighth transistor M8 has a first electrode configured to receive the clock blocking signal CLKB, a gate configured to receive the clock blocking signal CLKB, and a second electrode connected with the second pull-down node PD2. The ninth transistor M9 has a first electrode configured to receive the pull-up selection signal, a gate configured to receive the pull-up selection signal, and a second electrode connected with a gate of the twelfth transistor M12. The tenth transistor M10 has a first electrode configured to receive the second pull-down selection signal, a gate configured to receive the second pull-down selection signal, and a second electrode connected with the gate of the twelfth transistor M12. The eleventh transistor M11 has a first electrode connected with the gate of the twelfth transistor M12, a gate configured to receive the first pull-down selection signal, and a second electrode connected with the second level signal input terminal 23. The twelfth transistor M12 has a first electrode connected with the second pull-down node PD2, and a second electrode connected with the second level signal input terminal 23.

The seventh transistor M7 is configured to be turned on when the clock signal CLK is the first level signal and to be turned off when the clock signal CLK is the second level signal. The eighth transistor M8 is configured to be turned on when the clock blocking signal CLKB is the first level signal and to be turned off when the clock blocking signal CLKB is the second level signal. The ninth transistor M9 is configured to be turned on when the pull-up selection signal is the first level signal so as to make the signal at the gate of the twelfth transistor M12 be the first level signal, and to be turned off when the pull-up selection signal is the second level signal. The tenth transistor M10 is configured to be turned on when the second pull-down selection signal is the first level signal, so as to make the signal at the gate of the twelfth transistor M12 be the first level signal; and to be turned off when the second pull-down selection signal is the second level signal. The eleventh transistor M11 is configured to be turned on when the first pull-down selection signal is the first level signal, so as to make the gate of the twelfth transistor M12 and the second level signal input terminal be connected with each other; and to be turned off when the first pull-down selection signal is the second level signal, so as to make the gate of the twelfth transistor M12 and the second level signal input terminal be disconnected from each other. The twelfth transistor M12 is configured to make the second pull-down node PD2 and the second level signal input terminal 23 be connected with each other when the signal at the gate of the twelfth transistor M12 is the first level signal; and to make the second pull-down node PD2 and the second level signal input terminal 23 be disconnected from each other when the signal at the gate of the twelfth transistor M12 is the second level signal.

Figure 8:
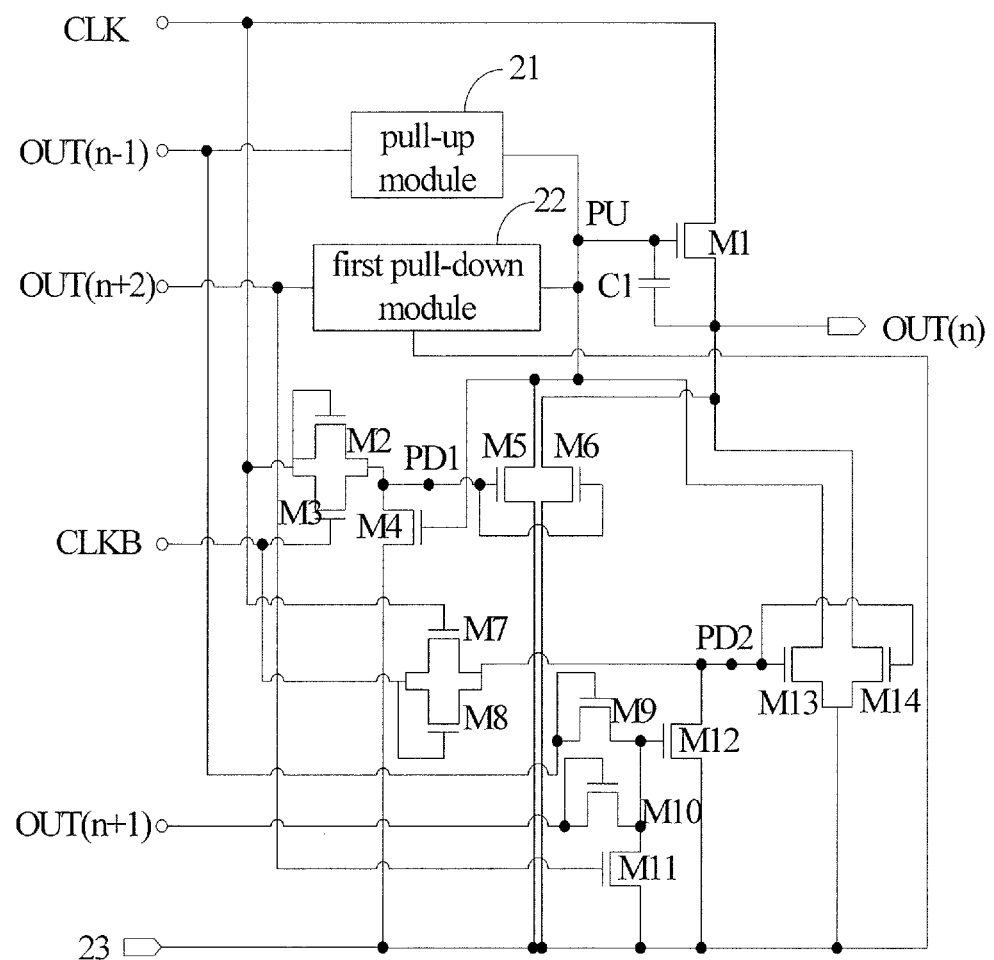
FIG. 8 is a seventh schematic structure diagram of the shift register unit provided in embodiments of the present disclosure.

Furthermore, as shown in FIG. 8, the second pull-down unit in the shift register unit provided in the embodiments of the present disclosure comprises a thirteenth transistor M13 and a fourteenth transistor M14. The thirteenth transistor M13 has a first electrode connected with the gate of the first transistor M1 (that is, the pull-up node PU), a gate connected with the second pull-down node PD2, and a second electrode connected with the second level signal input terminal 23. The fourteenth transistor M14 has a first electrode connected with the second electrode of the first transistor M1 (that is, the output terminal of the shift register unit), a gate connected with the second pull-down node PD2, and a second electrode connected with the second level signal input terminal 23.

The thirteenth transistor M13 is configured to be turned on when the signal at the second pull-down node PD2 is the first level signal, so as to make the gate of the first transistor M1 and the second level signal input terminal 23 be connected with each other; and to be turned off when the signal at the second pull-down node PD2 is the second level signal, so as to make the gate of the first transistor M1 and the second level signal input terminal 23 be disconnected from each other. The fourteenth transistor M14 is configured to be turned on when the signal at the second pull-down node PD2 is the first level signal, so as to make the second electrode of the first transistor M1 and the second level signal input terminal 23 be connected with each other; and to be turned off when the signal at the second pull-down node PD2 is the second level signal, so as to make the second electrode of the first transistor M1 and the second level signal input terminal 23 be disconnected from each other.

Figure 9:
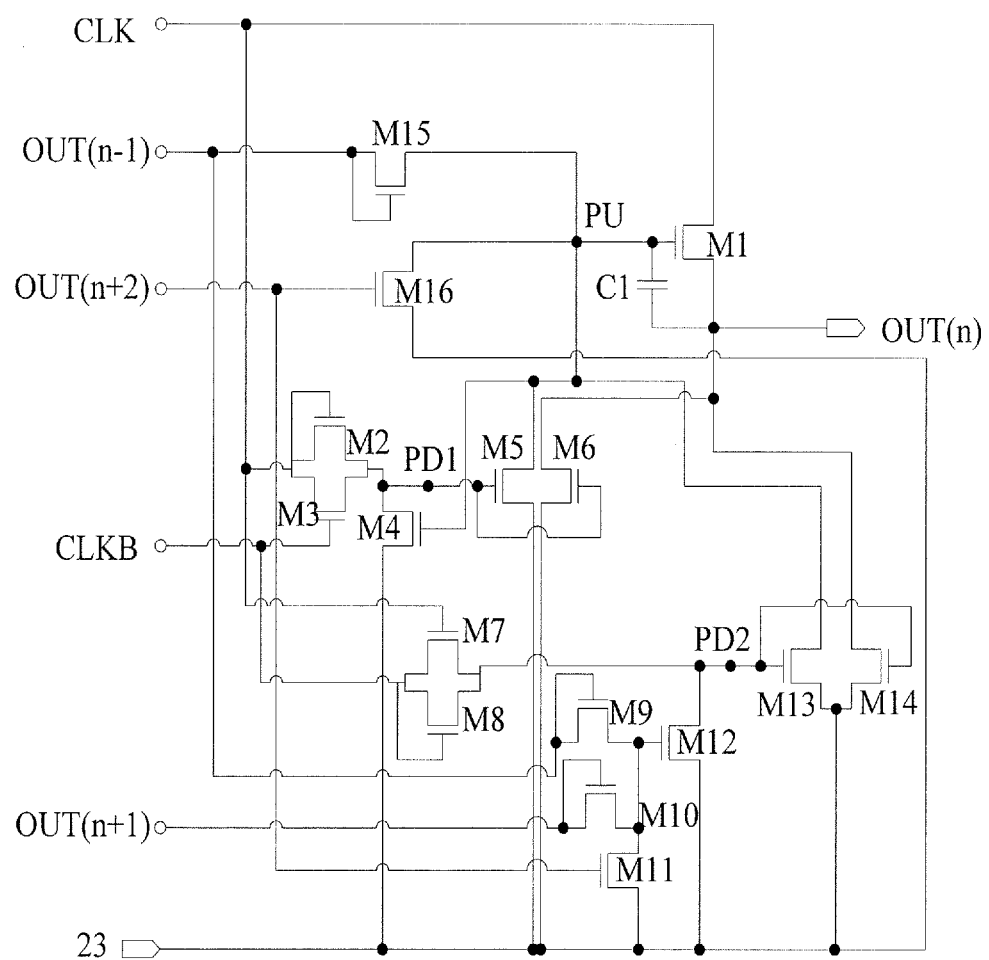
FIG. 9 is an eighth schematic structure diagram of the shift register unit provided in the embodiments of the present disclosure.

Furthermore, as shown in FIG. 9, the pull-up module in the shift register unit provided in the embodiments of the present disclosure comprises a fifteenth transistor M15. The fifteenth transistor M15 has a first electrode configured to receive the pull-up selection signal, a gate configured to receive the pull-up selection signal, and a second electrode connected to the gate of the first transistor M1. The fifteenth transistor M15 is configured to be turned on when the pull-up selection signal is the first level signal, so as to make the signal at the gate of the first transistor M1 be the first level signal; and to be turned off when the pull-up selection signal is the second level signal.

Furthermore, as shown in FIG. 9, the first pull-down module in the shift register unit provided in the embodiments of the present disclosure comprises a sixteenth transistor M16. The sixteenth transistor M16 has a first electrode connected to the gate of the first transistor M1, a gate configured to receive the first pull-down selection signal, and a second electrode connected to the second level signal input terminal 23 (that is, the pull-up node PU). The sixteenth transistor M16 is configured to be turned on when the first pull-down selection signal is the first level signal, so as to make the gate of the first transistor M1 and the second level signal input terminal be connected with each other; and to be turned off when the first pull-down selection signal is the second level signal.

Figure 10:
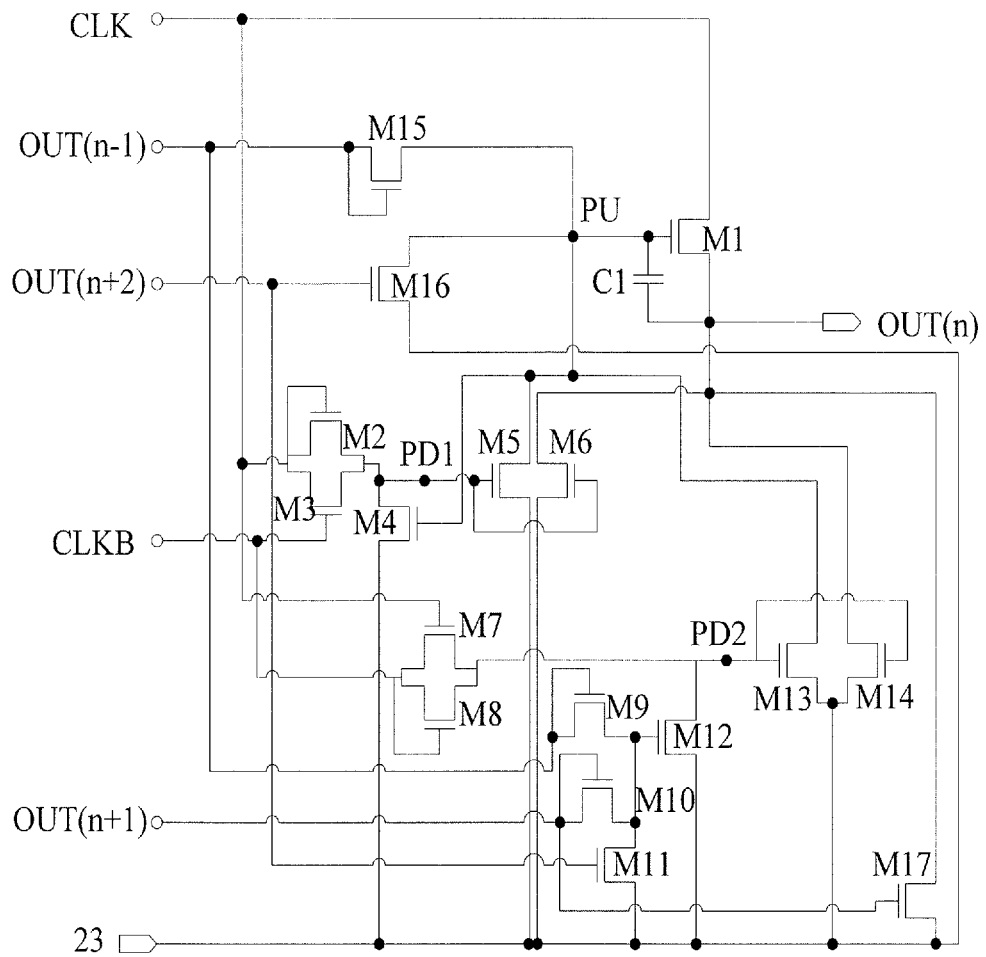
FIG. 10 is a ninth schematic structure diagram of the shift register unit provided in the embodiments of the present disclosure.

Furthermore, as shown in FIG. 10, the shift register unit provided in the embodiments of the present disclosure further comprises a seventeenth transistor M17. The seventeenth transistor M17 has a first electrode connected to the second electrode of the first transistor M1 (that is, the output terminal of the shift register unit), a gate configured to receive the second pull-down selection signal, and a second electrode connected to the second level signal input terminal 23. The seventeenth transistor M17 is configured to be turned on when the second pull-down selection signal is the first level signal, so as to make the second electrode of the first transistor M1 (that is, the output terminal of the shift register unit) and the second level signal input terminal be connected with each other, thus cooperating with the first transistor M1 to change the level at the gate line connected to the shift register unit from the first level to the second level; and to be turned off when the second pull-down selection signal is the second level signal.

For a transistor in the field of liquid crystal display or the field of organic light-emitting diode, a drain and a source are not distinguished definitely, therefore a first electrode of a transistor as mentioned in the embodiments of the present disclosure may be a source (or a drain) of the transistor, and a second electrode of a transistor as mentioned in the embodiments of the present disclosure may be a drain (or a source) of the transistor. A drain of a transistor is referred to as a second electrode in a case in which a source of the transistor is referred to as a first electrode; a source of a transistor is referred to as a second electrode in a case in which a drain of the transistor is referred to as a first electrode.

In a case in which the transistors as mentioned in the embodiments of the present disclosure are N type transistors, the first level signal is a high level signal, the second level signal is a low level signal, and the second level signal input terminal is a low level signal input terminal. in a case in which the transistors as mentioned in the embodiments of the present disclosure are P type transistors, the first level signal is a low level signal, the second level signal is a high level signal, and the second level signal input terminal is a high level signal input terminal.

Figure 11:
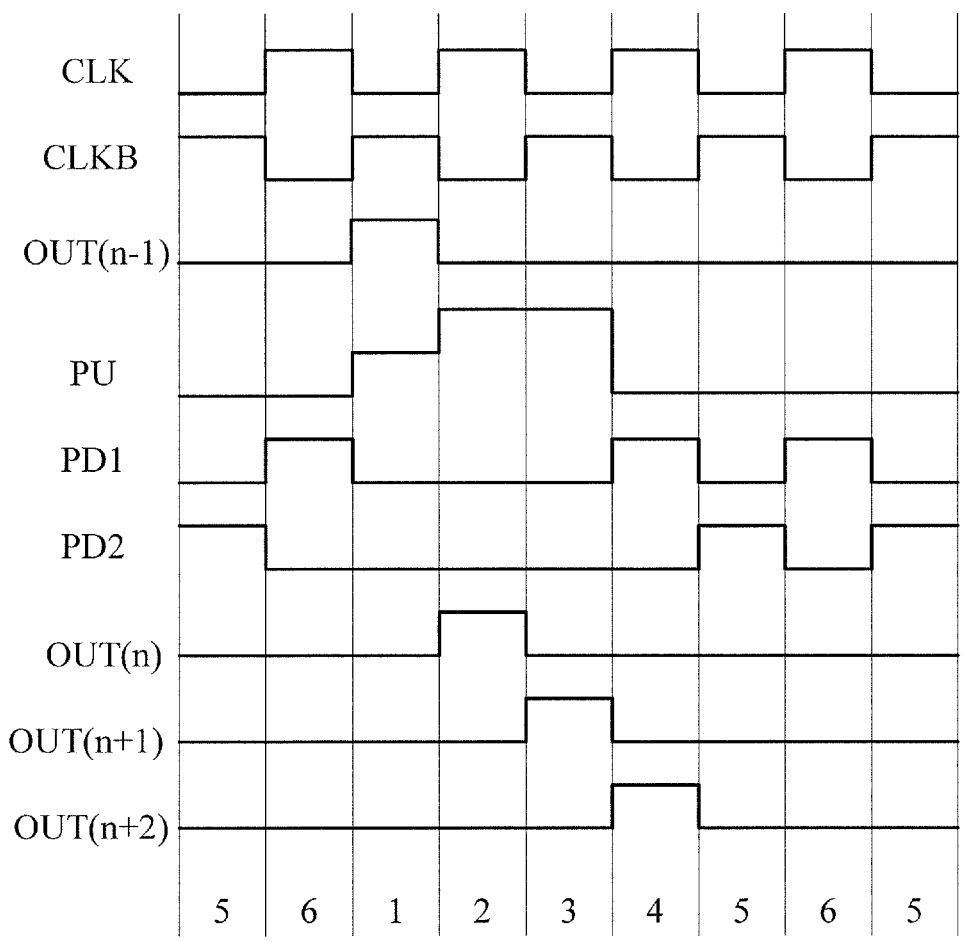
FIG. 11 is an operational timing diagram of the shift register unit provided in the embodiments of the present disclosure.

In order to further explain the shift register unit provided in the embodiments of the present disclosure, operational principle of the shift register unit provided in the embodiments of the present disclosure will be described by taking a case in which the transistors as mentioned in the embodiments of the present disclosure are N type transistors as an example and referring to the timing diagram as shown in FIG. 11. In this circumstance, the first level signal is the high level signal, the second level signal is the low level signal, and the second level signal input terminal is the low level signal input terminal.

As shown in FIG. 11, taking the $n^{th}$ stage of shift register unit as an example, when the shift register unit (FIG. 9 and FIG. 10) provided in the embodiments of the present disclosure has the operational timing including six phases. In such circumstance, the pull-up selection signal is the signal OUT (n−1) output from the $(n-1)^{th}$ stage of shift register unit, the first pull-down selection signal is the signal OUT(n+2) output from the $(n+2)^{th}$ stage of shift register unit, and the second pull-down selection signal is the signal OUT(n+1) output from the $(n+1)^{th}$ stage of shift register unit.

During a first phase, the clock signal CLK is the low level signal, the clock blocking signal CLKB is the high level signal, the pull-up selection signal is the high level signal such that the fifteenth transistor M15 is turned on, and the first pull-down selection signal is the low level signal such that the sixteenth transistor M16 is turned off. Meanwhile, the fourth transistor M4 is turned on since the signal at the pull-up node PU is the high level signal, such that the first pull-down node PD1 and the second level signal input terminal 23 (that is, the low level signal input terminal) are connected with each other. The fifth transistor M5 and the sixth transistor M6 are both turned off since the signal at the first pull-down node PD1 is the low level signal. The ninth transistor M9 is turned on since the pull-up selection signal is the high level signal, so that the signal at the gate of the twelfth transistor M12 is the high level signal, the twelfth transistor M12 is turned on, and thus the second pull-down node PD2 and the second level signal input terminal 23 (that is, the low level signal input terminal) are connected with each other. The thirteenth transistor M13 and the fourteenth transistor M14 are both turned off since the signal at the second pull-down node PD2 is the low level signal. Therefore, the gate of the first transistor M1 and the output terminal of the shift register unit are both disconnected from the low level signal input terminal, the signal at the gate of the first transistor M1 (that is the pull-up node PU) is the high level signal and thus the first transistor M1 is turned on, and the signal OUT(n) output from the $n^{th}$ stage of shift register unit is the low level signal, such that the level at the gate line connected to the shift register unit is the low level.

During a second phase, the clock signal CLK is the high level signal, the clock blocking signal CLKB is the low level signal, the pull-up selection signal is the low level signal such that the fifteenth transistor M15 is turned off, and the first pull-down selection signal is the high level signal such that the sixteenth transistor M16 is turned on. Due to the charge storage function of the first capacitor C1, the signal at the pull-up node PU is still the high level signal and thus the fourth transistor M4 is turned on, so that the first pull-down node PD1 and the low level signal input terminal are connected with each other. The fifth transistor M5 and the sixth transistor M6 are both turned off since the signal at the first pull-down node PD1 is the low level signal. The seventh transistor M7 is turned on since the clock signal CLK is the high level signal, such that the signal at the second pull-down node PD2 is the low level signal and thus the thirteenth transistor M13 and the fourteenth transistor M14 are both turned off. Therefore, the gate of the first transistor M1 and the output terminal of the shift register unit are both disconnected from the low level signal input terminal, the signal at the gate of the first transistor M1 (that is, the pull-up node PU) is the high level signal and thus the first transistor M1 is turned on, and the signal OUT(n) output from the $n^{th}$ stage of shift register unit is the high level signal. That is, the gate line connected to the shift register unit is charged through the first transistor M1, such that the level at the gate line connected to the shift register unit becomes the high level. Meanwhile, the second electrode of the first transistor M1 is changed from the low level signal in the first phase to the high level signal in the second phase, such that the potential at the pull-up node PU is further increased.

During a third phase, the signal at the pull-up node PU is still the high level signal due to the charge storage function of the first capacitor C1, such that the fourth transistor M4 is turned on and thus the first pull-down node PD1 and the low level signal input terminal are connected with each other. The fifth transistor M5 and the sixth transistor M6 are both turned off since the signal at the first pull-down node PD1 is the low level signal. Meanwhile, the tenth transistor M10 is turned on since the second pull-down selection signal is the high level signal, such that the signal at the gate of the twelfth transistor M12 is the high level signal, and thus the twelfth transistor M12 is turned on, and the second pull-down node PD2 and the second level signal input terminal 23 (that is, the low level signal input terminal) are connected with each other. The thirteenth transistor M13 and the fourteenth transistor M14 are both turned off since the signal at the second pull-down signal is the low level signal. Therefore, the gate of the first transistor M1 and the output terminal of the shift register unit are both disconnected from the low level signal input terminal. The sixteenth transistor M16 is turned off since the first pull-down selection signal is the low level signal, such that the signal at the pull-up node PU is kept to be the high level signal and thus the first transistor M1 is kept to be turned on. At this time, since the clock signal CLK is the low level signal and the level at the gate line connected to the shift register unit is the high level during the second phase, the high level signal at the gate line connected to the shift register unit is changed to the low level signal under the effect of the first transistor M1 being turned on. Therefore, the first transistor M1 in the shift register unit can achieve the function of increasing and decreasing of the level at the gate line connected to the shift register unit. In addition, in FIG. 10, the high level signal of the second pull-down selection signal can make the seventeenth transistor M17 be turned on, such that the output terminal of the shift register unit and the low level signal input terminal are connected with each other. Therefore, in the shift register unit as shown in FIG. 10, the high level signal at the gate line connected to the shift register unit not only can be changed to the low level signal through the first transistor M1 being turned on, but also is released to the low level signal input terminal through the seventeenth transistor M17.

During a fourth phase, the sixteenth transistor M16 is turned on since the first pull-down selection signal is the high level signal, such that the pull-up node PU and the low level signal input terminal are connected with each other. The first transistor M1 is turned off since the signal at the pull-up node PU is the low level signal, and thus the shift register unit does not output the received clock signal any longer. The second transistor M2 is turned on since the clock signal CLK is the high level signal, and meanwhile the fourth transistor M4 is turned off since the signal at the pull-up node PU is the low level signal, such that the signal at the first pull-down node PD1 is the high level signal, and thus the fifth transistor M5 and the sixth transistor M6 are turned on so that the pull-up node PU and the output terminal of the shift register unit are both connected with the low level signal input terminal. In addition, the eleventh transistor M11 is turned on since the first pull-down selection signal is the high level signal, such that the gate of the twelfth transistor M12 is connected with the low level signal input terminal, and thus a high level signal stored by a parasitic capacitance in the twelfth transistor M12 (which origins from the pull-up selection signal during the first phase and the second pull-down selection signal during the third phase) can be released to the low level signal input terminal. Therefore, it can be avoided that the twelfth transistor M12 is turned on and the signal at the second pull-down node PD2 is abnormal during subsequent phases when the potential at the gate of the twelfth transistor M12 is a high level.

During a fifth phase, the eighth transistor M8 is turned on since the clock signal CLK is the low level signal and the clock blocking signal CLKB is the high level signal, and meanwhile the ninth transistor M9, the tenth transistor M10 and the eleventh transistor M11 are all turned off since the pull-up selection signal, the first pull-down selection signal and the second pull-down selection signal are the low level signals, such that the twelfth transistor M12 is turned off, and thus the signal at the second pull-down node PD2 is the high level signal. Then, the thirteenth transistor M13 and the fourteenth transistor M14 are turned on, such that the gate of the first transistor M1 and the output terminal of the shift register unit are both connected with the low level signal input terminal.

During a sixth period, the second transistor M2 is turned on since the clock signal CLK is the low level signal and the clock blocking signal CLKB is the high level signal, and meanwhile the fourth transistor M4 is turned off since the signal at the pull-up node PU is kept at the low level signal when the pull-up selection signal is the low level signal, such that the signal at the first pull-down node PD1 is the high level signal. Then, the fifth transistor M5 and the sixth transistor M6 are both turned on, such that the gate of the first transistor M1 and the output terminal of the shift register unit are both connected with the low level signal input terminal.

Thereafter, the fifth phase and the sixth phase are repeated sequentially until the pull-up selection signal received by the shift register unit provided in the embodiments of the present disclosure is the high level signal such that the first phase is performed again. During the first, second and third phases, the gate line connected to the shift register unit is activated, and during the fourth, fifth and sixth phases, the gate line connected to the shift register unit is deactivated.

During the fifth and sixth phases, the signal at the first pull-down node PD1 is same as the clock signal CLK, and the signal at the second pull-down node PD2 is same as the clock blocking signal CLKB; the signal at the second pull-down node PD2 controls the thirteenth transistor M13 and the fourteenth transistor M14 to be turned off when the first pull-down node PD1 controls the fifth transistor M5 and the sixth transistor M6 to be turned on; and the signal at the second pull-down node PD2 controls the thirteenth transistor M13 and the fourteenth transistor M14 to be turned on when the first pull-down node PD1 controls the fifth transistor M5 and the sixth transistor M6 to be turned off. In such manner, such phenomenon that some transistors in the shift register unit are turned on for a long time during the periods in which the gate line connected to the shift register unit is deactivated so as to render the drifts in the threshold voltages of these transistors can be avoided, thus prolonging the lifespan of a driving circuit comprising the shift register unit.

The difference between a P type transistor and an N-type transistor only lies in that: the P type transistor is turned on when the signal received at a gate thereof is a low level signal and is turned off when the signal received at the gate thereof is a high level signal; while the N type transistor is turned on when the signal received at a gate thereof is a high level signal and is turned off when the signal received at the gate thereof is a low level signal. Therefore, the operational principle of a shift register unit in which transistors are all P type transistors is similar with that of the shift register unit in which the transistors are all N type transistors, details omitted.

In the embodiments of the present disclosure, there is further provided a display device comprising the shift register unit provided in the embodiments of the present disclosure.

The sequence numbers of the embodiments of the present disclosure are only for illustrative, but do not represent the performance of the embodiments.

It will be obvious that those skilled in the art may make modifications, variations and equivalences to the above embodiments without departing from the spirit and scope of the present disclosure as defined by the following claims. Such variations and modifications are intended to be covered within the spirit and scope of the present disclosure.

What is claimed is:

1. A shift register unit, comprising: a first capacitor, a first transistor, a pull-up module, a first pull-down module and a second pull-down module, wherein
the first transistor has a first electrode configured to receive a clock signal, a gate connected with one terminal of the first capacitor, the pull-up module and the first pull-down module, and a second electrode connected with the other terminal of the first capacitor;
the pull-up module is configured to output a first level signal to the gate of the first transistor when the clock signal is at a second level and a pull-up selection signal is at a first level; and to not output the first level signal to the gate of the first transistor when the clock signal is at the first level and the pull-up selection signal is at the second level, wherein the pull-up selection signal is a signal output from a shift register unit one-stage previous to the shift register unit;
the first pull-down module is configured to control the gate of the first transistor to be connected to a second level signal input terminal when the clock signal is at the first level and a first pull-down selection signal is at the first level, wherein the first pull-down selection signal is a signal output from a shift register unit two-stage subsequent to the shift register unit;
the first transistor is configured to output the received clock signal from the second electrode of the first transistor when a signal at the gate of the first transistor is at the first level; and to not output the received clock signal from the second electrode of the first transistor when the signal at the gate of the first transistor is at the second level; and
the second pull-down module is connected with the gate and the second electrode of the first transistor and is configured to control the gate and the second electrode of the first transistor to be connected with the second level signal input terminal when the signal at the gate of the first transistor is at the second level, the clock signal is at the first level and a clock blocking signal is at the second level; to control the gate and the second electrode of the first transistor to be disconnected from the second level signal input terminal when the signal at the gate of the first transistor is at the second level, the clock signal is at the second level and a clock blocking signal is at the first level; and to control the gate and the second electrode of the first transistor to be disconnected from the second level signal input terminal when the signal at the gate of the first transistor is at the first level.

2. The shift register unit of claim 1, wherein the second pull-down module comprises a first pull-down driving unit and a first pull-down unit, a connection point at which the first pull-down driving unit and the first pull-down unit are connected with each other is a first pull-down node; wherein
the first pull-down driving unit is configured to control a signal at the first pull-down node to be at the second level when the signal at the gate of the first transistor is at the first level; to control the signal at the first pull-down node to be at the first level when the signal at the gate of the first transistor is at the second level, the clock signal is at the first level and the clock blocking signal is at the second level; and to control the signal at the first pull-down node to be at the second level when the signal at the gate of the first transistor is at the second level, the clock signal is at the second level and the clock blocking signal is at the first level; and
the first pull-down unit is configured to control the gate and the second electrode of the first transistor to be connected with the second level signal input terminal when the signal at the first pull-down node is at the first level; and to control the gate and the second electrode of the first transistor to be disconnected from the second level signal input terminal when the signal at the first pull-down node is at the second level.

3. The shift register unit of claim 2, wherein the first pull-down driving unit comprises a second transistor, a third transistor and a fourth transistor, wherein
the second transistor has a first electrode configured to receive the clock signal, a gate configured to receive the clock signal, and a second electrode connected with the first pull-down node; the third transistor has a first electrode configured to receive the clock signal, a gate configured to receive the clock blocking signal, and a second electrode connected with the first pull-down node; the fourth transistor has a first electrode connected with the first pull-down node, a gate connected with the gate of the first transistor, and a second electrode connected with the second level signal input terminal;

the second transistor is configured to be turned on when the clock signal is at the first level and to be turned off when the clock signal is at the second level;

the third transistor is configured to be turned on when the clock blocking signal is at the first level and to be turned off when the clock blocking signal is at the second level; and the fourth transistor is configured to connect the first pull-down node with the second level signal input terminal when the signal at the gate of the first transistor is at the first level; and to disconnect the first pull-down node from the second level signal input terminal when the signal at the gate of the first transistor is at the second level.

4. The shift register unit of claim 2, wherein the first pull-down unit comprises a fifth transistor and a sixth transistor, wherein the fifth transistor has a first electrode connected with the gate of the first transistor, a gate connected with the first pull-down node, and a second electrode connected with the second level signal input terminal; the sixth transistor has a first electrode connected with the second electrode of the first transistor, a gate connected with the first pull-down node, and a second electrode connected with the second level signal input terminal;

the fifth transistor is configured to connect the gate of the first transistor with the second level signal input terminal when the signal at the first pull-down node is at the first level; and to disconnect the gate of the first transistor from the second level signal input terminal when the signal at the first pull-down node is at the second level; and the sixth transistor is configured to connect the second electrode of the first transistor with the second level signal input terminal when the signal at the first pull-down node is at the first level; and to disconnect the second electrode of the first transistor from the second level signal input terminal when the signal at the first pull-down node is at the second level.

5. The shift register unit of claim 1, further comprising a third pull-down module connected with the gate and the second electrode of the first transistor, wherein the third pull-down module is configured to control the gate and the second electrode of the first transistor to be disconnected from the second level signal input terminal when the pull-up selection signal is at the first level, or a second pull-down selection signal is at the first level or the clock blocking signal is at the second level; to control the gate and the second electrode of the first transistor to be connected with the second level signal input terminal when the pull-up selection signal, the first pull-down selection signal and the second pull-down selection signal are all at the second level, the clock signal is at the second level and the clock blocking signal is at the first level, wherein the second pull-down selection signal is a signal output from a shift register unit one-stage subsequent to the shift register unit.

6. The shift register unit of claim 5, wherein the third pull-down module comprises a second pull-down driving unit and a second pull-down unit, a connection point at which the second pull-down driving unit and the second pull-down unit are connected with each other is a second pull-down node, wherein the second pull-down driving unit is configured to control a signal at the second pull-down node to be at the second level when the pull-up selection signal is at the first level, or a second pull-down selection signal is at the first level or the clock blocking signal is at the second level; and to control the signal at the second pull-down node to be at the first level when the pull-up selection signal, the first pull-down selection signal and the second pull-down selection signal are all at the second level, the clock signal is at the second level and the clock blocking signal is at the first level; and the second pull-down unit is configured to control the gate and the second electrode of the first transistor to be connected with the second level signal input terminal when the signal at the second pull-down node is at the first level; and to control the gate and the second electrode of the first transistor to be disconnected from the second level signal input terminal when the signal at the second pull-down node is at the second level.

7. The shift register unit of claim 6, wherein the second pull-down driving unit comprises a seventh transistor, an eighth transistor, a ninth transistor, a tenth transistor, an eleventh transistor and a twelfth transistor, wherein the seventh transistor has a first electrode configured to receive the clock blocking signal, a gate configured to receive the clock signal, and a second electrode connected with the second pull-down node; the eighth transistor has a first electrode configured to receive the clock blocking signal, a gate configured to receive the clock blocking signal, and a second electrode connected with the second pull-down node; the ninth transistor has a first electrode configured to receive the pull-up selection signal, a gate configured to receive the pull-up selection signal, and a second electrode connected with a gate of the twelfth transistor; the tenth transistor has a first electrode configured to receive the second pull-down selection signal, a gate configured to receive the second pull-down selection signal, and a second electrode connected with the gate of the twelfth transistor; the eleventh transistor has a first electrode connected with the gate of the twelfth transistor, a gate configured to receive the first pull-down selection signal, and a second electrode connected with the second level signal input terminal; the twelfth transistor has a first electrode connected with the second pull-down node, and a second electrode connected with the second level signal input terminal;

the seventh transistor is configured to be turned on when the clock signal is at the first level and to be turned off when the clock signal is at the second level;

the eighth transistor is configured to be turned on when the clock blocking signal is at the first level and to be turned off when the clock blocking signal is at the second level;

the ninth transistor is configured to control the signal at the gate of the twelfth transistor to be at the first level when the pull-up selection signal is at the first level; and to be turned off when the pull-up selection signal is at the second level;

the tenth transistor is configured to control the signal at the gate of the twelfth transistor to be at the first level when the second pull-down selection signal is at the first level; and to be turned off when the second pull-down selection signal is at the second level;

the eleventh transistor is configured to connect the gate of the twelfth transistor with the second level signal input terminal when the first pull-down selection signal is at the first level; and to disconnect the gate of the twelfth transistor from the second level signal input terminal when the first pull-down selection signal is at the second level; and the twelfth transistor is configured to connect the second pull-down node with the second level signal input terminal when the signal at the gate of the twelfth transistor is at the first level; and disconnect the second pull-down node from the second level signal input terminal when the signal at the gate of the twelfth transistor is at the second level.

8. The shift register unit of claim 6, wherein the second pull-down unit comprises a thirteenth transistor and a fourteenth transistor, wherein the thirteenth transistor has a first electrode connected with the gate of the first transistor, a gate connected with the second pull-down node, and a second electrode connected with the second level signal input terminal; the fourteenth transistor has a first electrode connected with the second electrode of the first transistor, a gate connected with the second pull-down node, and a second electrode connected with the second level signal input terminal;

the thirteenth transistor is configured to connect the gate of the first transistor with the second level signal input terminal when the signal at the second pull-down node is at the first level; and to disconnect the gate of the first transistor from the second level signal input terminal when the signal at the second pull-down node is at the second level;

the fourteenth transistor is configured to connect the second electrode of the first transistor with the second level signal input terminal when the signal at the second pull-down node is at the first level; and to disconnect the second electrode of the first transistor from the second level signal input terminal when the signal at the second pull-down node is at the second level.

9. The shift register unit of claim 1, wherein the pull-up module comprises a fifteenth transistor, wherein the fifteenth transistor has a first electrode configured to receive the pull-up selection signal, a gate configured to receive the pull-up selection signal, and a second electrode connected to the gate of the first transistor; and the fifteenth transistor is configured to control the signal at the gate of the first transistor to be at the first level when the pull-up selection signal is at the first level; and to be turned off when the pull-up selection signal is at the second level.

10. The shift register unit of claim 1, wherein the first pull-down module comprises a sixteenth transistor, wherein the sixteenth transistor has a first electrode connected to the gate of the first transistor, a gate configured to receive the first pull-down selection signal, and a second electrode connected to the second level signal input terminal; and the sixteenth transistor is configured to connect the gate of the first transistor with the second level signal input terminal when the first pull-down selection signal is at the first level, and to be turned off when the first pull-down selection signal is at the second level.

11. A display device comprising a plurality stages of the shift register units of claim 1.

12. The display device of claim 11, wherein the second pull-down module comprises a first pull-down driving unit and a first pull-down unit, a connection point at which the first pull-down driving unit and the first pull-down unit are connected with each other is a first pull-down node; wherein the first pull-down driving unit is configured to control a signal at the first pull-down node to be at the second level when the signal at the gate of the first transistor is at the first level; to control the signal at the first pull-down node to be at the first level when the signal at the gate of the first transistor is at the second level, the clock signal is at the first level and the clock blocking signal is at the second level; and to control the signal at the first pull-down node to be at the second level when the signal at the gate of the first transistor is at the second level, the clock signal is at the second level and the clock blocking signal is at the first level; and the first pull-down unit is configured to control the gate and the second electrode of the first transistor to be connected with the second level signal input terminal when the signal at the first pull-down node is at the first level; and to control the gate and the second electrode of the first transistor to be disconnected from the second level signal input terminal when the signal at the first pull-down node is at the second level.

13. The display device of claim 12, wherein the first pull-down driving unit comprises a second transistor, a third transistor and a fourth transistor, wherein the second transistor has a first electrode configured to receive the clock signal, a gate configured to receive the clock signal, and a second electrode connected with the first pull-down node; the third transistor has a first electrode configured to receive the clock signal, a gate configured to receive the clock blocking signal, and a second electrode connected with the first pull-down node; the fourth transistor has a first electrode connected with the first pull-down node, a gate connected with the gate of the first transistor, and a second electrode connected with the second level signal input terminal;

the second transistor is configured to be turned on when the clock signal is at the first level and to be turned off when the clock signal is at the second level;

the third transistor is configured to be turned on when the clock blocking signal is at the first level and to be turned off when the dock blocking signal is at the second level; and the fourth transistor is configured to connect the first pull-down node with the second level signal input terminal when the signal at the gate of the first transistor is at the first level; and to disconnect the first pull-down node from the second level signal input terminal when the signal at the gate of the first transistor is at the second level.

14. The display device of claim 12, wherein the first pull-down unit comprises a fifth transistor and a sixth transistor, wherein the fifth transistor has a first electrode connected with the gate of the first transistor, a gate connected with the first pull-down node, and a second electrode connected with the second level signal input terminal; the sixth transistor has a first electrode connected with the second electrode of the first transistor, a gate connected with the first pull-down node, and a second electrode connected with the second level signal input terminal;

the fifth transistor is configured to connect the gate of the first transistor with the second level signal input ferry final when the signal at the first pull-down node is at the first level; and to disconnect the gate of the first transistor from the second level signal input terminal when the signal at the first pull-down node is at the second level; and the sixth transistor is configured to connect the second electrode of the first transistor with the second level signal input terminal when the signal at the first pull-down node is at the first level; and to disconnect the second electrode of the first transistor from the second level signal input terminal when the signal at the first pull-down node is at the second level.

15. The display device of claim 11, wherein the shift register unit further comprises a third pull-down module connected with the gate and the second electrode of the first transistor, wherein the third pull-down module is configured to control the gate and the second electrode of the first transistor to be disconnected from the second level signal input terminal when the pull-up selection signal is at the first level, or a second pull-down selection signal is at the first level or the clock blocking signal is at the second level; to control the gate and the second electrode of the first transistor to be connected with the second level signal input terminal when the pull-up selection signal, the first pull-down selection signal and the second pull-down selection signal are all at the second level, the clock signal is at the second level and the clock blocking signal is at the first level, wherein the second pull-down selection signal is a signal output from a shift register unit one-stage subsequent to the shift register unit.

16. The display device of claim 15, wherein the third pull-down module comprises a second pull-down driving unit and a second pull-down unit, a connection point at which the second pull-down driving unit and the second pull-down unit are connected with each other is a second pull-down node, wherein the second pull-down driving unit is configured to control a signal at the second pull-down node to be at the second level when the pull-up selection signal is at the first level, or a second pull-down selection signal is at the first level or the clock blocking signal is at the second level; and to control the signal at the second pull-down node to be at the first level when the pull-up selection signal, the first pull-down selection signal and the second pull-down selection signal are all at the second level, the clock signal is at the second level and the dock blocking signal is at the first level; and the second pull-down unit is configured to control the gate and the second electrode of the first transistor to be connected with the second level signal input terminal when the signal at the second pull-down node is at the first level; and to control the gate and the second electrode of the first transistor to be disconnected from the second level signal input terminal when the signal at the second pull-down node is at the second level.

17. The display device of claim 16, wherein the second pull-down driving unit comprises a seventh transistor, an eighth transistor, a ninth transistor, a tenth transistor, an eleventh transistor and a twelfth transistor, wherein the seventh transistor has a first electrode configured to receive the clock blocking signal, a gate configured to receive the clock signal, and a second electrode connected with the second pull-down node; the eighth transistor has a first electrode configured to receive the clock blocking signal, a gate configured to receive the clock blocking signal and a second electrode connected with the second pull-down node; the ninth transistor has a first electrode configured to receive the pull-up selection signal, a gate configured to receive the pull-up selection signal, and a second electrode connected with a gate of the twelfth transistor; the tenth transistor has a first electrode configured to receive the second pull-down selection signal, a gate configured to receive the second pull-down selection signal, and a second electrode connected with the gate of the twelfth transistor; the eleventh transistor has a first electrode connected with the gate of the twelfth transistor, a gate configured to receive the first pull-down selection signal, and a second electrode connected with the second level signal input terminal; the twelfth transistor has a first electrode connected with the second pull-down node, and a second electrode connected with the second level signal input terminal;

the seventh transistor is configured to be turned on when the clock signal is at the first level and to be turned off when the clock signal is at the second level;

the eighth transistor is configured to be turned on when the clock blocking signal is at the first level and to be turned of when the clock blocking signal is at the second level;

the ninth transistor is configured to control the signal at the gate of the twelfth transistor to be at the first level when the pull-up selection signal is at the first level; and to be turned off when the pull-up selection signal is at the second level;

the tenth transistor is configured to control the signal at the gate of the twelfth transistor to be at the first level when the second pull-down selection signal is at the first level; and to be turned off when the second pull-down selection signal is at the second level;

the eleventh transistor is configured to connect the gate of the twelfth transistor with the second level signal input terminal when the first pull-down selection signal is at the first level; and to disconnect the gate of the twelfth transistor from the second level signal input terminal when the first pull-down selection signal is at the second level; and the twelfth transistor is configured to connect the second pull-down node with the second level signal input terminal when the signal at the gate of the twelfth transistor is at the first level; and disconnect the second pull-down node from the second level signal input terminal when the signal at the gate of the twelfth transistor is at the second level.

18. The display device of claim 16, wherein the second pull-down unit comprises a thirteenth transistor and a fourteenth transistor, wherein the thirteenth transistor has a first electrode connected with the gate of the first transistor, a gate connected with the second pull-down node, and a second electrode connected with the second level signal input terminal; the fourteenth transistor has a first electrode connected with the second electrode of the first transistor, a gate connected with the second pull-down node, and a second electrode connected with the second level signal input terminal;

the thirteenth transistor is configured to connect the gate of the first transistor with the second level signal input terminal when the signal at the second pull-down node is at the first level; and to disconnect the gate of the first transistor from the second level signal input terminal when the signal at the second pull-down node is at the second level;

the fourteenth transistor is configured to connect the second electrode of the first transistor with the second level signal input terminal when the signal at the second pull-down node is at the first level; and to disconnect the second electrode of the first transistor from the second level signal input terminal when the signal at the second pull-down node is at the second level.

19. The display device of claim 11, wherein the pull-up module comprises a fifteenth transistor, wherein the fifteenth transistor has a first electrode configured to receive the pull-up selection signal, a gate configured to receive the pull-up selection signal, and a second electrode connected to the gate of the first transistor; and the fifteenth transistor is configured to control the signal at the gate of the first transistor to be at the first level when the pull-up selection signal is at the first level; and to be turned off when the pull-up selection signal is at the second level.

20. The display device of claim 11, wherein the first pull-down module comprises a sixteenth transistor, wherein the sixteenth transistor has a first electrode connected to the gate of the first transistor, a gate configured to receive the first pull-down selection signal, and a second electrode connected to the second level signal input terminal; and the sixteenth transistor is configured to connect the gate of the first transistor with the second level signal input terminal when the first pull-down selection signal is at the first level, and to be turned off when the first pull-down selection signal is at the second level.

* * * * *